(12) United States Patent
Hirschler et al.

(10) Patent No.: US 9,673,096 B2
(45) Date of Patent: Jun. 6, 2017

(54) METHOD FOR PROCESSING A SEMICONDUCTOR SUBSTRATE AND A METHOD FOR PROCESSING A SEMICONDUCTOR WAFER

(71) Applicant: INFINEON TECHNOLOGIES AG, Neubiberg (DE)

(72) Inventors: Joachim Hirschler, Villach (AT); Michael Roesner, Villach (AT); Markus Juch Heinrici, Viktring (AT); Gudrun Stranzl, Goedersdorf (AT); Martin Mischitz, Wernberg (AT); Martin Zgaga, Rosegg (AT)

(73) Assignees: INFINEON TECHNOLOGIES AG, Neubiberg (DE); Technische Universitaet Graz, Graz (AT)

( * ) Notice: Subject to any disclaimer, the term of this patent is extended or adjusted under 35 U.S.C. 154(b) by 0 days.

(21) Appl. No.: 14/541,239

(22) Filed: Nov. 14, 2014

(65) Prior Publication Data

US 2016/0141208 A1    May 19, 2016

(51) Int. Cl.
*H01L 21/78* (2006.01)
*H01L 21/288* (2006.01)
(Continued)

(52) U.S. Cl.
CPC ............ *H01L 21/78* (2013.01); *H01L 21/288* (2013.01); *H01L 21/3213* (2013.01); *H01L 21/6835* (2013.01); *H01L 24/03* (2013.01); *H01L 24/06* (2013.01); *H01L 24/94* (2013.01); *H01L 24/95* (2013.01); *H01L 23/562* (2013.01); *H01L 24/05* (2013.01); *H01L 2221/68327* (2013.01); *H01L 2221/68363* (2013.01); *H01L 2221/68368* (2013.01); *H01L 2224/03002* (2013.01); *H01L 2224/03005* (2013.01); *H01L 2224/039* (2013.01); *H01L 2224/03009* (2013.01); *H01L 2224/0332* (2013.01); *H01L 2224/0345* (2013.01); *H01L 2224/03452* (2013.01); *H01L 2224/03464* (2013.01); *H01L 2224/03505* (2013.01); *H01L 2224/03848* (2013.01); *H01L 2224/05794* (2013.01); *H01L 2224/05847* (2013.01); *H01L 2224/06181* (2013.01); *H01L 2224/94* (2013.01); *H01L 2224/95* (2013.01)

(58) Field of Classification Search
CPC ........... H01L 21/76254; H01L 21/2007; H01L 21/76251; H01L 21/187; H01L 21/78; H01L 21/288; H01L 21/3213; H01L 21/6835; H01L 21/324
USPC ........ 438/455, 114, 465, 502, 509, 660, 663
See application file for complete search history.

(56) References Cited

U.S. PATENT DOCUMENTS 7,994,026 B2 *   8/2011   Harikai ............. H01J 37/32743
                                                     257/E21.214
8,569,132 B2 *  10/2013   Machida ........... H01L 29/66068
                                                           257/329

(Continued)

*Primary Examiner* — Chuong A Luu
(74) *Attorney, Agent, or Firm* — Viering, Jentschura & Partner mbB

(57) ABSTRACT

According to various embodiments, a method for processing a semiconductor substrate may include: covering a plurality of die regions of the semiconductor substrate with a metal; forming a plurality of dies from the semiconductor substrate, wherein each die of the plurality of dies is covered with the metal; and, subsequently, annealing the metal covering at least one die of the plurality of dies.

17 Claims, 11 Drawing Sheets

(51) Int. Cl.
*H01L 21/3213* (2006.01)
*H01L 21/683* (2006.01)
*H01L 23/00* (2006.01)

(56) References Cited

U.S. PATENT DOCUMENTS

| | | | | |
|---|---|---|---|---|
| 2003/0015342 A1* | 1/2003 | Sakamoto | ........... | H01L 21/4846 |
| | | | | 174/250 |
| 2011/0014777 A1* | 1/2011 | Haji | .................... | H01L 21/0273 |
| | | | | 438/465 |
| 2013/0328172 A1* | 12/2013 | Tischler | .................. | H01L 21/78 |
| | | | | 257/620 |

* cited by examiner

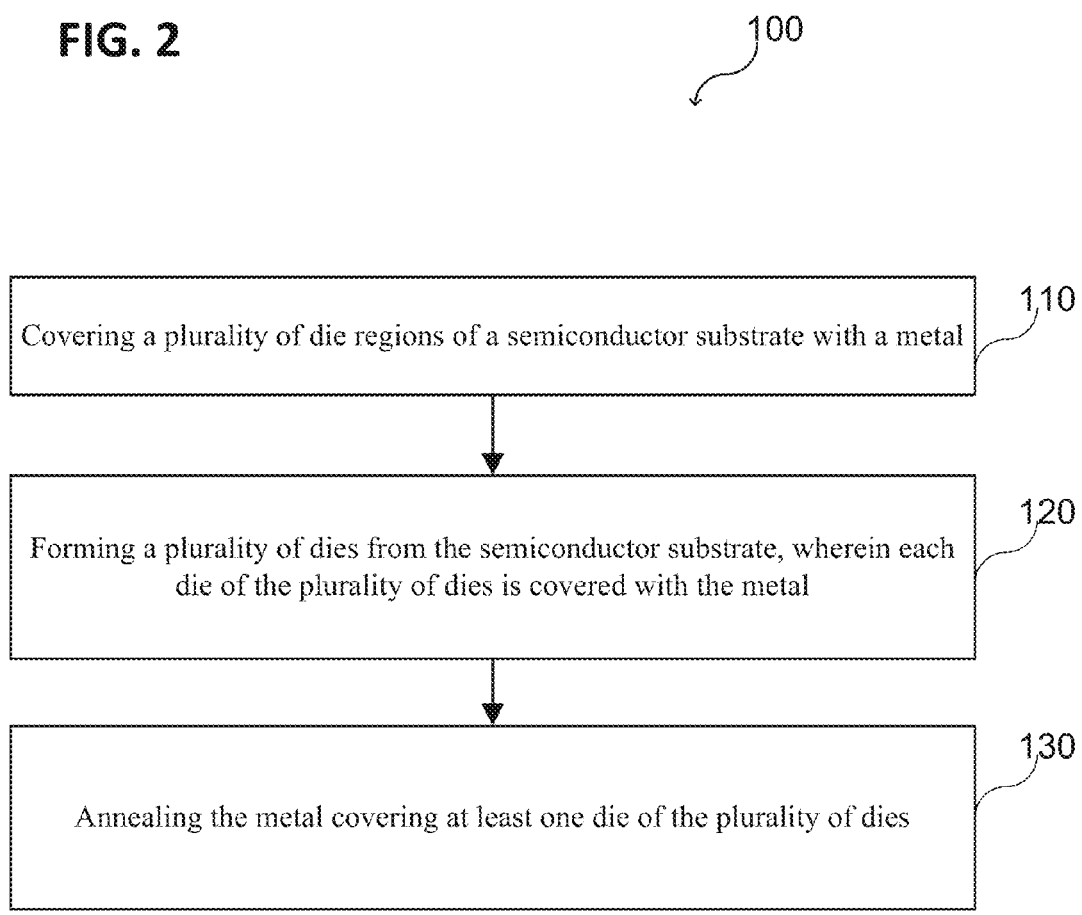

METHOD FOR PROCESSING A SEMICONDUCTOR SUBSTRATE AND A METHOD FOR PROCESSING A SEMICONDUCTOR WAFER

TECHNICAL FIELD

Various embodiments generally relate to a method for processing a semiconductor substrate and to a method for processing a semiconductor wafer.

BACKGROUND

In general, metals may be used in semiconductor processing for electrically contacting a die, a chip, or any other semiconductor work piece. Conventionally, a metallization may be formed on wafer-level, e.g. a metallization may be formed over respective die regions or chip regions of a wafer and finally, the wafer may be singulated into a plurality of dies or chips. A chip or a die may include a front side metallization, typically including a specific wiring which may be required for operating the die or chip. Further, e.g. in case of vertically integrated semiconductor dies or chips, a backside metallization or a backside contact pad may be provided. The backside metallization may be formed for example after the wafer is thinned to a desired thickness, e.g. by grinding the backside.

SUMMARY

According to various embodiments, a method for processing a semiconductor substrate may include: covering a plurality of die regions of the semiconductor substrate with a metal; forming a plurality of dies from the semiconductor substrate, wherein each die of the plurality of dies is covered with the metal; and, subsequently, annealing the metal covering at least one die of the plurality of dies.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows a schematic flow diagram of a method for processing a semiconductor substrate according to various embodiments;

DESCRIPTION

Figure 1A:
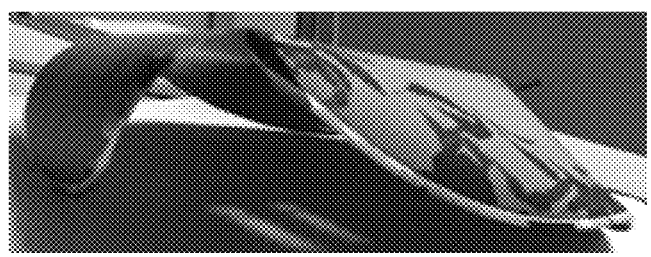
FIGS. 1A and 1B show respectively a semiconductor wafer processed by conventionally used methods.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The term "porosity" used with regards to a porous material, a porous layer, or porous metal layer may be used herein to mean a measure of the voids (also referred to as void spaces, empty spaces, or pores) in a material between 0 and 1 (which may be also expressed as a percentage between 0 and 100%), wherein the porosity is a fraction of the volume of voids over the total volume. A material with a porosity of 0 may have the greatest material specific density.

According to various embodiments, the term "metal" used with regards to a metal layer, a metal particle, a metal nano-particle, a metal micro-particle, may be used herein to mean a metal, e.g. copper, silver, nickel, aluminum, gold, or the like, as well as a metal alloy, e.g. an alloy of two or more than two metals, e.g. a copper/aluminum alloy, as well as an alloy of at least one metal and a metalloid, e.g. a copper/silicon alloy, an aluminum/silicon alloy, or an copper/aluminum/silicon alloy. Illustratively, a metal may include any material having the typical properties of metals, e.g. metals may be opaque, shiny, and have a high electrical and thermal conductivity. Further, metals may be malleable and ductile.

According to various embodiments, a carrier (e.g. a substrate, a wafer, or a work piece) may be made of or may include semiconductor materials of various types, including, for example, silicon, germanium, Group III to V or other types, including polymers, for example, although in another embodiment, other suitable materials can also be used. In an embodiment, the carrier is made of silicon (doped or undoped), in an alternative embodiment, the carrier is a silicon on insulator (SOI) wafer. As an alternative, any other suitable semiconductor materials can be used for the carrier, for example semiconductor compound material such as gallium arsenide (GaAs), indium phosphide (InP), but also any suitable ternary semiconductor compound material or quaternary semiconductor compound material such as indium gallium arsenide (InGaAs). According to various embodiments, the carrier may be a thin or an ultrathin substrate or wafer, e.g. with a thickness in the range from about several micrometers to about several tens of micrometers, e.g. in the range from about 3 µm to about 50 µm, e.g. with a thickness less than about 100 µm or less than about 50 µm. According to various embodiments, a carrier may include SiC (silicon carbide) or may be a silicon carbide carrier, a silicon carbide substrate, a silicon carbide wafer, or a silicon carbide work piece.

In general, it may be desired to electrically contact a semiconductor material or an electrically conductive metal oxide, a metal nitride, or a metal oxynitride with a metal, e.g. with a pure metal, wherein the metal may be for example in direct contact with the semiconductor material or with the electrically conductive metal oxide, the metal nitride, or the metal oxynitride. However, the metal may have typically a greater coefficient of thermal expansion (CTE) than the semiconductor material or the electrically conductive metal oxide, the metal nitride, or the metal oxynitride (e.g. measured at 20° C.). For example, silicon may have a CTE (e.g. referred to the linear CTE) of about 2.6 ppm/K, gallium arsenide may have a CTE of about 6.9 ppm/K, silicon nitride may have a CTE of about 3.2 ppm/K, silicon carbide may have a CTE of about 3 ppm/K, aluminum nitride may have a CTE of about 4 ppm/K, aluminum oxide may have a CTE of about 7 ppm/K, whereas aluminum may have a CTE of about 23 ppm/K, copper may have a CTE of about 17 ppm/K, gold may have a CTE of about 14 ppm/K, and silver may have a CTE of about 18 ppm/K.

Therefore, a metal layer formed for example at a surface of a semiconductor substrate may cause mechanical stress or strain in the semiconductor substrate when the temperature changes. Metals having for example a low CTE may have other drawbacks, for example, a low thermal conductivity (e.g. measured at 20° C.) or inappropriate mechanical properties and/or electrical properties, e.g. tungsten with a CTE of about 4.5 ppm/K may have a thermal conductivity less than 180 W/mK, whereas copper may have a thermal conductivity of about 400 W/mK and silver may have a thermal conductivity of about 430 W/mK. Therefore, according to various embodiments, copper may be used for electrically contacting a semiconductor carrier, e.g. a semiconductor substrate or a semiconductor wafer.

Figure 1B:
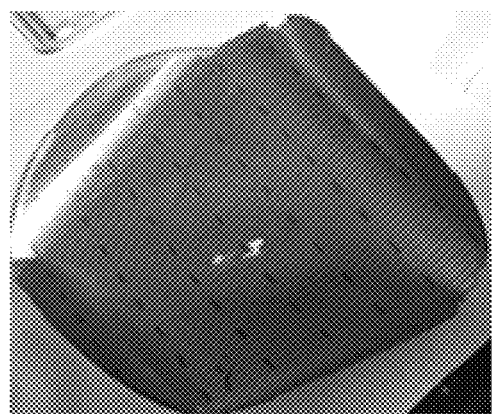

Currently available methods for printing a backside metallization include for example copper paste as metal material. A sintering process for sintering the copper paste on the wafer may require increased temperature (or in other words an annealing or heat treatment). The wafer may be heated up for example to a temperature of about 400° C. which results in huge mechanical stress due to mismatch of thermal expansion coefficients in combination with specific bulk moduli. If substantially the whole wafer is covered with the copper metal paste, the whole wafer may be subjected to mechanical stress during sintering; and this may cause strong deformation of the wafer or even a breakage of the wafer. FIG. 1A shows a silicon wafer in a side view and FIG. 1B shows a silicon wafer in a front view after applying a copper paste over the wafer and after sintering the copper paste by currently available methods. Conventionally, the copper paste may be sintered before the wafer is diced and, therefore, mechanical stress can affect the wafer. For example, if the wafer is a thin wafer or an ultra-thin wafer, e.g. with a thickness less than about 100 µm or less than about 50 µm, the wafer may not withstand the stress caused by the metal layer formed over the wafer. As a result, the wafer may be deformed, e.g. during a heat treatment, wherein the deformation (and the probability of breakage) increases for a thicker metal layer and a thinner wafer.

Further, currently used thermo-elastic glue may have a low viscosity. Therefore, at elevated temperatures, the glue may be distributed over the wafer in an uncontrolled manner. This contributes to further mechanical stress or to inappropriate location of the glue. It may be difficult to implement conventionally used processes for forming a backside metallization using on-the-wafer-sintered-material for mass production purpose. It was recognized that the stress exerted on the wafers during the sintering process has to be reduced. Further, alternative glue may be used during the sintering process.

According to various embodiments, a process flow is proposed for processing a carrier (e.g. a substrate or a wafer), or in other words, for forming a backside metallization on a plurality of dies diced from a carrier. For reduction of wafer stress a sintering process may be carried out after die separation (e.g. after plasma dicing).

FIG. 2 shows a schematic flow diagram of a method 100 for processing a semiconductor carrier (e.g. a semiconductor substrate) according to various embodiments. The method 100 may include: in 110, covering a plurality of die regions of a semiconductor substrate with a metal; in 120, forming a plurality of dies from the semiconductor substrate, wherein each die of the plurality of dies is covered with the metal; and, subsequently in 130, annealing the metal covering at least one die of the plurality of dies.

According to various embodiments, the annealing may be performed to sinter the metal, e.g. if the metal is provided in form of particles, and/or to anneal (cure) the metal, e.g. if the metal is deposited by physical vapor deposition (PVD) or chemical vapor deposition (CVD), or if the metal is plated (e.g. electroless plated). According to various embodiments, annealing the metal may for example increase the density of the metal, or in other words, reduce the porosity of the metal. Further, during annealing, the microstructure of the metal may be influenced and, therefore, the electrical conductivity and/or the thermal conductivity of the metal may be increased. According to various embodiments, the annealing temperature used for annealing a metal may be related to the melting point of the metal, wherein for a metal with a higher melting point also a higher annealing temperature may be required. According to various embodiments, copper particles may be sintered at a temperature of about 400° C. According to various embodiments, the annealing duration used for annealing a metal may be also related to the melting point of the metal, wherein for a metal with a higher melting point also a longer annealing duration may be required. According to various embodiments, the annealing duration used for annealing copper particles may be in the range from about 15 min to about 60 min.

According to various embodiments, the annealing may be performed at a temperature greater than or equal to about 200° C., about 250° C., about 300° C., or about 350° C., e.g. at a temperature in the range from about 200° C. to about 500° C., or even at a temperature greater than about 500° C. The annealing duration may be greater than or equal to about 10 min, 20 min, 30 min, 40 min, 50 min, or 60 min, e.g. in the range from about 10 min to about 1 h, or even longer than about 1 h.

According to various embodiments, the annealing duration may be related to the annealing temperature, wherein the required annealing duration for annealing the metal may decrease for higher annealing temperatures. According to various embodiments, the annealing may include heating the metal to a temperature of greater than about 250° C. for more than 15 min. According to various embodiments, for copper, the annealing may include heating the metal to a temperature of greater than about 350° C. for more than 10 min.

According to various embodiments, the annealing may be performed in a gas atmosphere, e.g. in forming gas (a mixture of hydrogen and nitrogen), or in a reducing gas, e.g. including or consisting of formic acid.

Figure 3A:
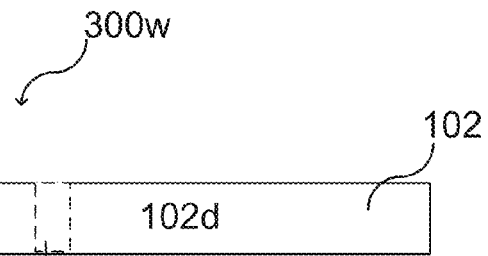
FIGS. 3A to 3D show a semiconductor substrate respectively in a schematic cross sectional view at various stages during processing according to various embodiments.

FIG. 3A illustrates a semiconductor substrate 102 in a schematic cross sectional view at an initial processing stage, e.g. before process 110 of method 100 is carried out. According to various embodiments, the semiconductor substrate 102 may be completely processed in any suitable semiconductor technology.

According to various embodiments, the semiconductor substrate 102 may be a semiconductor wafer having for example a width (e.g. diameter) in the range from about 5 cm to about 50 cm, e.g. in the range from about 10 cm to about 50 cm, or a width greater than about 10 cm, 20 cm, or 30 cm.

According to various embodiments, the semiconductor substrate 102 may be a silicon wafer 102 or may include at least a silicon layer. According to various embodiments, the semiconductor substrate 102 may be a recon wafer or any other suitable wafer used in semiconductor processing for handling a plurality of dies on wafer-level.

According to various embodiments, the semiconductor substrate 102 may have a thickness less than about 100 µm, 90 µm, 80 µm, 70 µm, 60 µm, 50 µm, 40 µm, 30 µm, 20 µm, 10 µm, or 5 µm. According to various embodiments, the semiconductor substrate 102 may be thinned, e.g. by grinding and/or etching, to a thickness less than about 100 µm, 90 µm, 80 µm, 70 µm, 60 µm, 50 µm, 40 µm, 30 µm, 20 µm, 10 µm, or 5 µm before method 100 is carried out, e.g. before dicing and/or before the annealing. According to various embodiments, the semiconductor substrate 102 may be mounted on a glass carrier for thinning the semiconductor substrate 102. Therefore, the dies singulated from the semiconductor substrate 102 may be adhered to the glass carrier after dicing.

According to various embodiments, the semiconductor substrate 102 may include one or more integrated circuits or one or more integrated circuit structures. According to various embodiments, each die region of the semiconductor substrate may include at least one integrated circuit or at least one integrated circuit structure.

The integrated circuit structure may include at least one of the following: an integrated transistor, an integrated capacitor, an integrated coil, an integrated resistor or any other integrated circuit structure used in semiconductor technology, an integrated battery. According to various embodiments, the integrated circuit structure may be formed at least one of over and in a semiconductor body. According to various embodiments, the integrated circuit or integrated circuit structure respectively provided in the die regions 102d of the semiconductor substrate 102 may include at least one of the following semiconductor devices: a two terminal device, e.g. a diode (e.g. a PIN diode or a Schottky diode, e.g. a SiC Schottky diode), and/or a three terminal device, e.g. a MOSFET (metal oxide semiconductor field-effect transistor), a JFET (junction gate field-effect transistor), e.g. a SiC JFET, a thyristor (e.g. in metal oxide semiconductor (MOS) technology), an IGBT (insulated-gate bipolar transistor), or the like. According to various embodiments, the integrated circuit or integrated circuit structure respectively provided in the die regions 102d of the semiconductor substrate 102 may include a completely processed integrated circuit or integrated circuit structure in any technology, e.g. in MOS technology or in CMOS (complementary metal oxide semiconductor) technology.

According to various embodiments, at least one die singulated from the semiconductor carrier 102 may include or may be at least one of the following: a completely processed integrated circuit, a CMOS (complementary metal oxide semiconductor) integrated circuit, a bipolar transistor, an IGBT, and/or a micro-electro-mechanical system (MEMS), or another component or another structure, as for example, a chip, a memory chip, a die, a microprocessor, a microcontroller, a memory structure, a charge storage memory, a random access memory, a dynamic random access memory, a logic circuit, a sensor, a nano-sensor, an integrated transceiver, a micro-mechanical device, a micro-electronic device, a nano-electronic device, an electrical circuit, a digital circuit, an analog circuit, and any other electronic device based on semiconductor technology.

Further, at least one die singulated from the semiconductor carrier 102 may include or may be a semiconductor power device, e.g. including a power integrated circuit (e.g. a power transistor, a power switch, a power diode, a power transceiver, a power amplifier, or the like). According to various embodiments, a semiconductor power device may be configured to be operated at high electrical voltages and high electrical currents, e.g. at a voltage greater than 30 V and/or with a current greater than 2 A, e.g. at a voltage greater than 100 V and/or with a current greater than 10 A. According to various embodiments, a semiconductor power device, such as a power diode, a power bipolar junction transistor, a power insulated gate bipolar transistor, or a power metal oxide semiconductor field-effect transistor (power MOSFET), may be operated at a voltage of up to 1000 V or up to 5000 V, and at a high current of up to 100 A or up to 5000 A. A semiconductor power device, or a power integrated circuit structure, as referred to herein, may be or may include at least one of the following: a two terminal power device, e.g. a power diode, and/or a three terminal device, e.g. a power MOSFET (e.g. a so called smart FET, smart MOSFET, or intelligent power MOSFET), a power JFET, a power thyristor, a power IGBT, or the like. Further, a semiconductor power device may be or may include any other suitable multi terminal device, e.g. with four or more than four terminals, e.g. a power transmitter device, a power receiver device, a power transceiver device, a power RF-(radio frequency)-switch, or the like.

According to various embodiments, the integrated circuit or integrated circuit structure may be configured as vertically integrated circuit structure. According to various embodiments, each die region 102d of the semiconductor substrate may include a vertically integrated circuit structure, e.g. the dies singulated from the semiconductor substrate 102 may include a front side and a back side (cf. for example FIG. 3C) and may be configured to provide an electrical current flow from the front side to the back side.

According to various embodiments, the die regions 102d of the semiconductor substrate 102 may be laterally separated from each other by one or more dicing regions 102k (also referred to as kerf 102k). Illustratively, a region 102k to singulate the dies from the semiconductor substrate 102 may be provided in the semiconductor substrate 102 between respectively adjacent die regions 102d (cf. for example FIG. 3C).

Figure 3B:
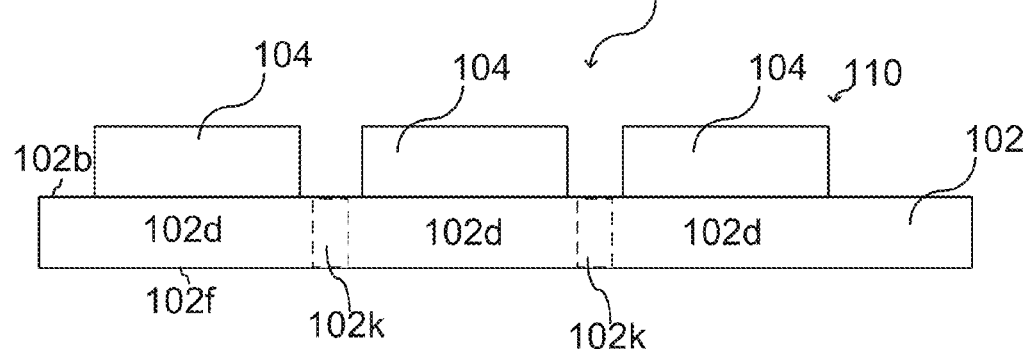

FIG. 3B illustrates the semiconductor substrate 102 in a schematic cross sectional view at a further processing stage, e.g. after process 110 of method 100 has been carried out. According to various embodiments, the die regions 102d of the semiconductor substrate 102 may be at least partially covered with the metal 104. Illustratively, the back side 102b of the semiconductor substrate 102 (which may also define the back side 102b of the dies singulated from the semiconductor substrate 102) may be partially or completely covered with the metal 104. Alternatively, the front side 102f of the semiconductor substrate 102 (which may also define the front side 102f of the dies singulated from the semiconductor substrate 102) may be partially or completely covered with the metal 104. Alternatively, the front side 102f and the back side 102b of the semiconductor substrate 102 may be partially or completely covered with the metal 104.

According to various embodiments, the metal 104 covering the die regions 102d of the semiconductor substrate 102 at least partially may be provided by forming (e.g. depositing or printing) a metal layer over the front side 102f and/or the back side 102b of the semiconductor substrate and patterning the metal layer. Alternatively, the metal 104 covering the die regions 102d of the semiconductor substrate 102 at least partially may be provided by forming a patterned layer (e.g. by stencil printing) over the front side 102f and/or the back side 102b of the semiconductor substrate.

According to various embodiments, depositing the metal layer may include a PVD process or a CVD process. Further, forming the metal layer may include plating, e.g. electroless plating. Further, forming the metal layer may include electroless deposition. Patterning the metal layer may include applying a mask layer (e.g. a hard mask or a soft mask) and etching the metal layer through the mask layer. Further, patterning the metal layer may include at least one photolithographic process.

According to various embodiments, the metal 104 covering the die regions 102d of the semiconductor substrate 102 at least partially may be provided by printing a suspension (e.g. an ink or a paste) over the die regions 102d of the semiconductor substrate 102 and pre-annealing (in other words pre-curing) the suspension after printing. According to various embodiments, the suspension may include the metal, e.g. in form of particles (e.g. micro-particles and/or nano-particles). According to various embodiments, the suspension may include copper, e.g. in form of copper particles (e.g. copper micro-particles and/or copper nano-particles). According to various embodiments, during the pre-annealing the suspension may be dried, e.g. the solvent may be at least partially expelled. According to various embodiments, the pre-annealing may be performed at a temperature less than or equal to about 200° C. According to various embodiments, the pre-annealing may be carried out at a lower temperature than the annealing, as described herein.

According to various embodiments, a particle suspension may be formed by introducing a metal powder including metal particles into a liquid solvent (e.g. into an organic liquid).

According to various embodiments, the suspension for providing the metal 104 over the semiconductor substrate 102 may be applied by stencil printing. Therefore, the suspension may be applied already with the desired pattern so that the dicing regions 102k may be for example free of the suspension or at least partially free of the suspension and therefore also free of the metal 104 or at least partially free of the metal 104.

According to various embodiments, the metal 104 covering the die regions 102d of the semiconductor substrate 102 may have a thickness greater than about 3 µm, e.g. a thickness of about 5 µm or greater than about 5 µm. Further, the metal 104 covering the die regions 102d of the semiconductor substrate 102 may have a thickness greater than or equal to about 25% of a thickness of the semiconductor substrate 102.

According to various embodiments, after process 110 of method 100 is carried out, the metal 104 may cover more than 50% (or e.g. more than 60%, 70%, 80%, or 90%) of the front side 102f and/or the back side 102b of the semiconductor substrate 102. According to various embodiments, the front side 102f and/or the back side 102b of the semiconductor substrate 102 may be completely covered with the metal 104. In this case, the dicing of the semiconductor substrate 102 may include sawing, e.g. vertically through the metal 104 and the semiconductor substrate 102.

According to various embodiments, the metal 104 may be patterned to at least partially expose the one or more dicing regions 102k (the kerf 102k). This may allow for example plasma dicing (e.g. by deep reactive ion etching) using the patterned metal 104 as mask.

Figure 3C:
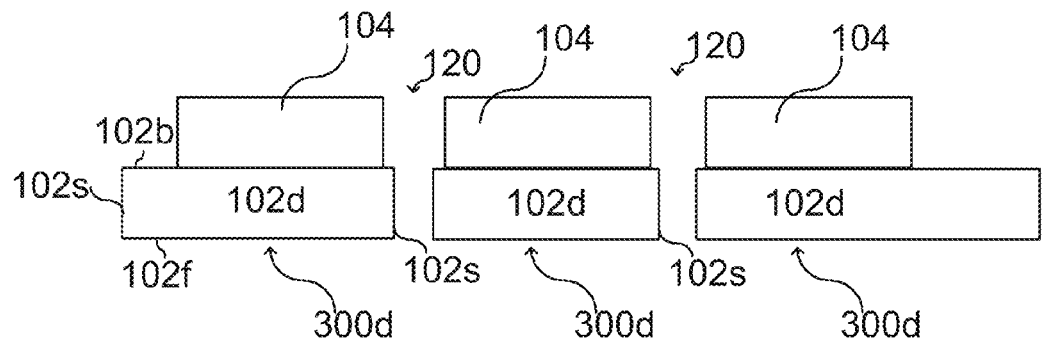

FIG. 3C illustrates the semiconductor substrate 102 in a schematic cross sectional view at a further processing stage, e.g. after processes 110 and 120 of method 100 have been carried out. According to various embodiments, forming the plurality of dies 300d from the semiconductor substrate 102 may include dicing, e.g. mechanical dicing using for example a dicing saw, thermal dicing using for example a laser, or chemical dicing using for example an etching process).

As already described, forming the plurality of dies 300d from the semiconductor substrate 102 may include plasma dicing, e.g. deep reactive ion etching, wherein the metal 104 covering the plurality of die regions 102d of the semiconductor substrate 102 may be used as mask for the plasma dicing, as illustrated for example in FIGS. 3B and 3C.

According to various embodiments, after processes 110 and 120 of method 100 have been carried out, the metal 104 may cover more than 80% (or e.g. more than 90%) of the front side 102f and/or of the back side 102b of the respective die 300d singulated from the semiconductor substrate 102. According to various embodiments, sides 102s (sidewalls 102s) of the singulated dies 300d generated by the dicing process may be free of the metal 104.

According to various embodiments, the metal 104 covering the respective die 300d singulated from the semiconductor substrate 102 may have a thickness greater than about 3 µm or a thickness of greater than or equal to about 3 µm. Further, the metal 104 covering the respective die 300d singulated from the semiconductor substrate 102 may have a thickness greater than or equal to about 25% of a thickness of the semiconductor substrate 102.

According to various embodiments, the semiconductor substrate 102 may be or may include a deposited thin film including for example silicon. Further, according to various embodiments, the semiconductor substrate 102 may be chemically thinned, e.g. by introducing an etch stop layer, e.g. by ion implantation, and wet etching.

Figure 3D:
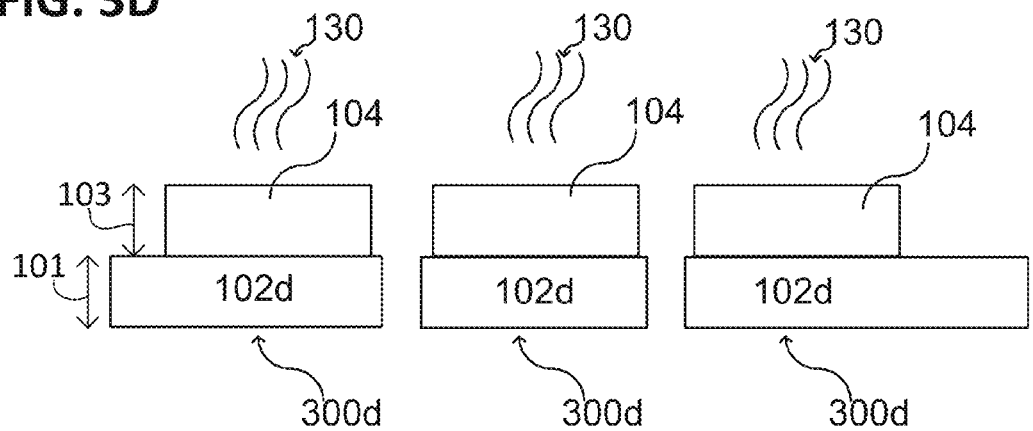

Further, according to various embodiments, at least one die 300d singulated from the semiconductor substrate 102, e.g. all dies 300d singulated from the semiconductor substrate 102, may be subjected to the annealing 130, as illustrated for example in FIG. 3D.

According to various embodiments, the metal 104 covering the respective annealed die 300d may have a thickness 103 greater than about 3 µm. Further, the metal 104 covering the respective annealed die 300d may have a thickness 103 greater than or equal to about 25% of a thickness 101 of the semiconductor substrate 102.

According to various embodiments, method 100 may further include adhering the at least one die 300*d* singulated from the semiconductor substrate 102 with the metal 104 to a metal layer before the annealing 130 is carried out. The metal layer may include or may be at least one of a metal foil, a lead frame, or any other suitable metal structure (cf. for example FIGS. 6A and 6B).

Alternatively, method 100 may further include adhering the at least one die 300*d* singulated from the semiconductor substrate 102 to an auxiliary carrier before the annealing 130 is carried out. According to various embodiments, one or more of the dies 300*d* singulated from the semiconductor substrate 102 may be transferred to the auxiliary carrier via a transfer foil (cf. for example FIG. 5).

Illustratively, the semiconductor substrate 102 may be thinned on a glass carrier, wherein the glass carrier may not withstand the annealing 130. Therefore, the dies 300*d* may be transferred to a temperature stable auxiliary carrier, e.g. including or made of polyimide (e.g. Kapton), so that the dies 300*d* can be annealed at a temperature of for example up to 400° C. Further, the dies 300*d* may be adhered to the auxiliary carrier via a temperature stable glue, e.g. via photo imide (e.g. applied by spin coating or spray coating), so that the the dies 300*d* can be annealed at a temperature of for example up to 400° C.

Various modifications and/or configurations of the processing of the semiconductor carrier are described in the following, wherein the features and/or functionalities described with reference to FIG. 2 and FIGS. 3A to 3D may be included analogously. Further, the features and/or functionalities described in the following may be included in the method 100 or may be combined with the method 100, as described before with reference to FIG. 2 and FIGS. 3A to 3D.

Figure 4:
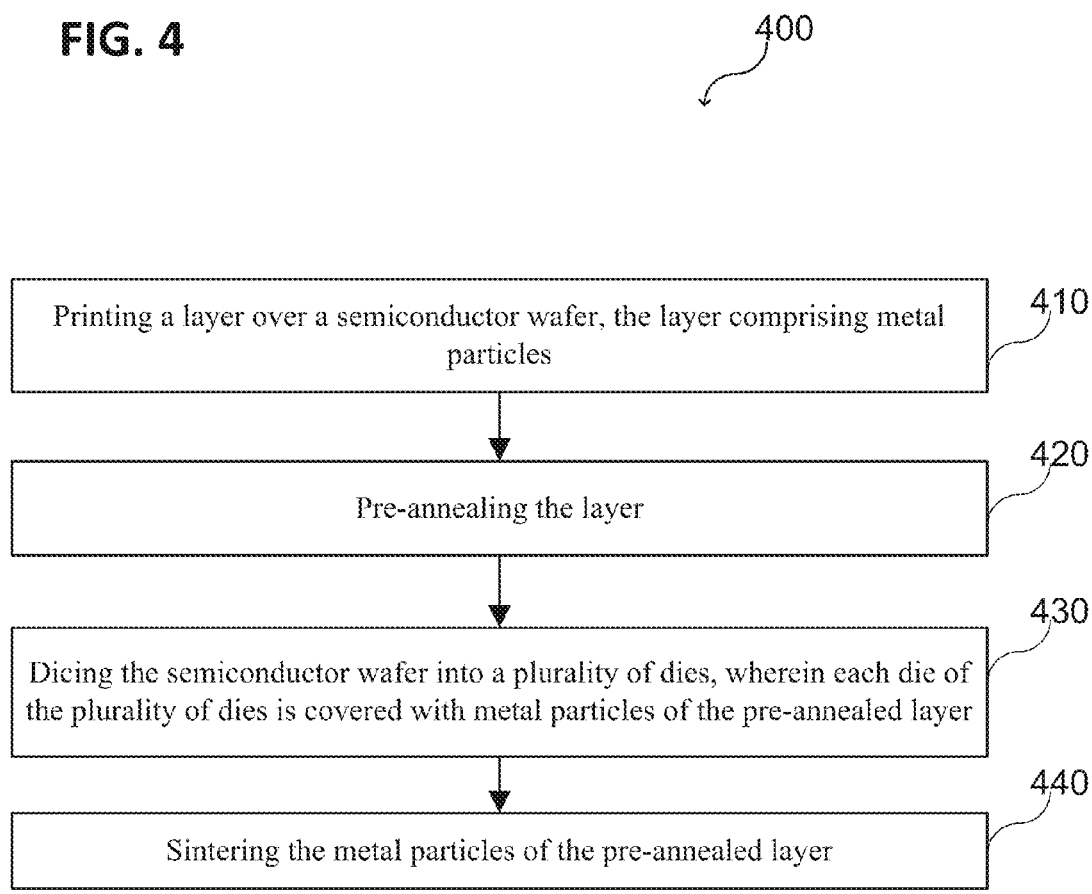
FIG. 4 shows a schematic flow diagram of a method for processing a semiconductor wafer according to various embodiments.

FIG. 4 shows a schematic flow diagram of a method 400 for processing a semiconductor carrier (e.g. a semiconductor wafer) according to various embodiments. The method 400 may include: in 410, printing a layer over a semiconductor wafer, the layer including metal particles (e.g. suspended in a solvent (also referred to as ink or paste)); in 420, pre-annealing the layer (e.g. to at least partially expel the solvent from the layer); in 430, dicing the semiconductor wafer into a plurality of dies, wherein each die of the plurality of dies is covered (e.g. at the front side and/or at the backside of the respective die) with metal particles of the pre-annealed layer; and, subsequently in 440, sintering the metal particles of the pre-annealed layer.

According to various embodiments, dicing the semiconductor wafer may include plasma dicing. Further, according to various embodiments, the sintered metal particles may provide a backside metallization at the backside of the respective die singulated from the semiconductor wafer. According to various embodiments, the metal particles may include copper particles, e.g. copper nano particles and/or copper micro particles.

The process flow described herein according to various embodiments may include a die separation (e.g. by plasma dicing) before the final metal sintering to limit the thermal expansion of the semiconductor carrier (e.g. the semiconductor substrate or the semiconductor wafer). Further, a temperature stable base film may be used (e.g. a polyimide film) as robust carrier system during the final metal sintering.

Alternatively, an additional thin metal layer, e.g. a foil, may be applied on the backside metallization of the dies during the sintering process. The additional thin metal layer may have a thickness less than about 1 mm, e.g. less than about 500 μm, e.g. less than about 100 μm.

According to various embodiments, the semiconductor substrate 102 or the semiconductor wafer 102 may be thinner than the metal 104. The metal 104 may for example stabilize the dies so that the dies can still be picked from the dicing foil in back-end processing using for example a conventional die bonder.

According to various embodiments, stencil printing of a metal paste, e.g. of a copper paste, may be used in combination with die separation (e.g. plasma dicing) and with different measures to stabilize the carrier (e.g. the wafer) during the metal sintering process.

Figure 5:
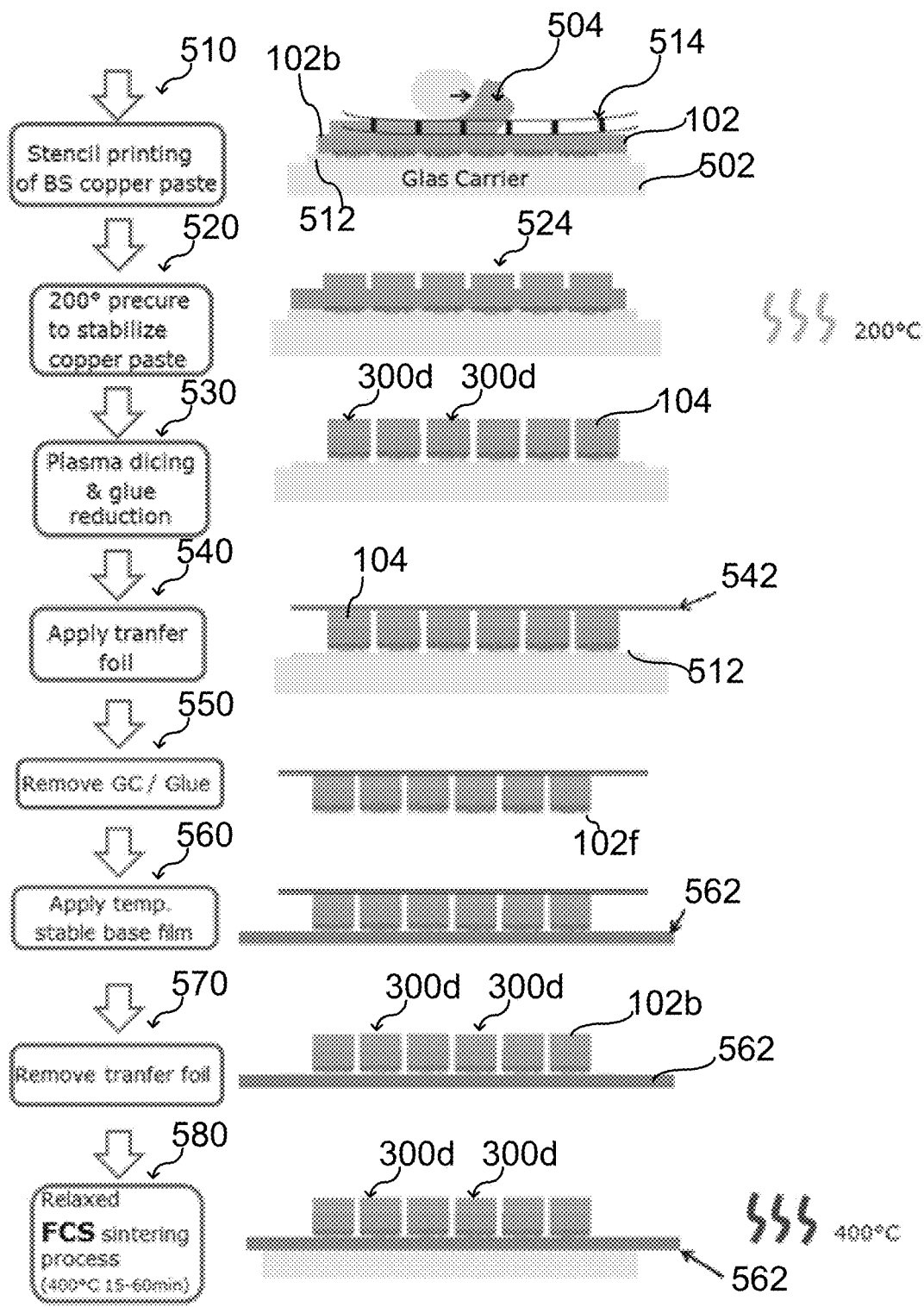
FIG. 5 shows a semiconductor substrate in a schematic cross sectional view at various stages during processing according to various embodiments.

FIG. 5 shows a semiconductor carrier 102 (e.g. semiconductor wafer 102) in a schematic cross sectional view at various stages during processing and a corresponding process flow according to various embodiments. The process flow may be used to form a printed backside-metallization for the dies singulated from the semiconductor carrier 102. The illustrated process flow may be adapted to any chip geometry.

The process flow illustrated in FIG. 5 may include for example at least one of the following: in 510, stencil printing of a metal paste 504, e.g. of a copper paste 504, e.g. on the backside 102*b* of the semiconductor carrier 102 (the semiconductor carrier 102 may be for example attached to a glass carrier 502 with a glue 512); in 520, pre-curing (also referred to as pre-annealing), e.g. to stabilize the metal paste (e.g. at a temperature of about 200° C.); in 530, plasma dicing the semiconductor carrier 102, e.g. additionally a glue reduction; in 540, applying a transfer foil 542 (in other words attaching a dicing foil 542 to the pre-cured metal paste of the separated dies 300*d*); in 550, removing the glass carrier 502 and the glue 512 from the separated dies 300*d*; in 560, applying a temperature stable base film 562 (in other words attaching the separated dies 300*d* with the front side 102*f* to the temperature stable base film 562); in 570, removing the transfer foil 542; and, in 580, performing a sintering process (e.g. a formic acid copper sintering, denoted FCS, at a temperature of about 400° C. for 15 min to 60 min for a copper paste 504). The pre-cured metal paste may be also referred to herein as the metal 104. The temperature stable base film 562 may be also referred to herein as auxiliary carrier.

Illustratively, the dies 300*d* may be transferred from the glass carrier 502 to the temperature stable base film 562 (e.g. to a Kapton tape including a temperature stable glue layer 512, e.g. spin/spray coated photo-imide) before sintering 580, as already described.

As illustrated in FIG. 5, the dies 300*d* may include a front side metallization at the front side 102*f* of the respective die 300*d*. Further, the metal paste 504 (e.g. the copper paste 504) may be printed with a stencil mask 514. This stencil mask 514 may define a pattern in the metal paste 504 serving later as mask 524 for the die separation 530 (e.g. for the plasma dicing) process. The metal paste 504 may be stabilized/cured by a first temperature process, e.g. for a copper paste 504 typically near 200° C. This first temperature process may be used to get rid of volatile solvents to make the die separation process 530 (e.g. the plasma dicing) possible. The die separation 530 (e.g. plasma dicing) may be carried out after curing 520, e.g. by using the metal mask 524, followed by a recess of the glue 512. The recess of the glue 512 may be used for particle reduction, to obtain clean die side walls and to define a glue layer removal. After applying the transfer foil 542, the glass carrier 502 and the glue 512 may be removed. The temperature stable base film 562, e.g. the Kapton (polyimide) tape 562, may be applied by using a further thin glue layer, e.g. by using spin coated, spray coated, or Inkjet-printed photo-imide. The sintering process 580 may be carried out after removing the transfer foil 542.

The sintering process 580 may be expansion compensated due to the die separation process 530 (e.g. due to the plasma dicing). Each die 300d (or chip 300d), now separated, can expand with much more freedom, compared to the whole semiconductor carrier 102 (e.g. wafer 102). Additionally, the dies 300d may be fixed on the temperature stable base foil 562. This may result in a reproducible and reliable back side metal sintering process, e.g. in front-end processing or back-end processing.

Figure 6A:
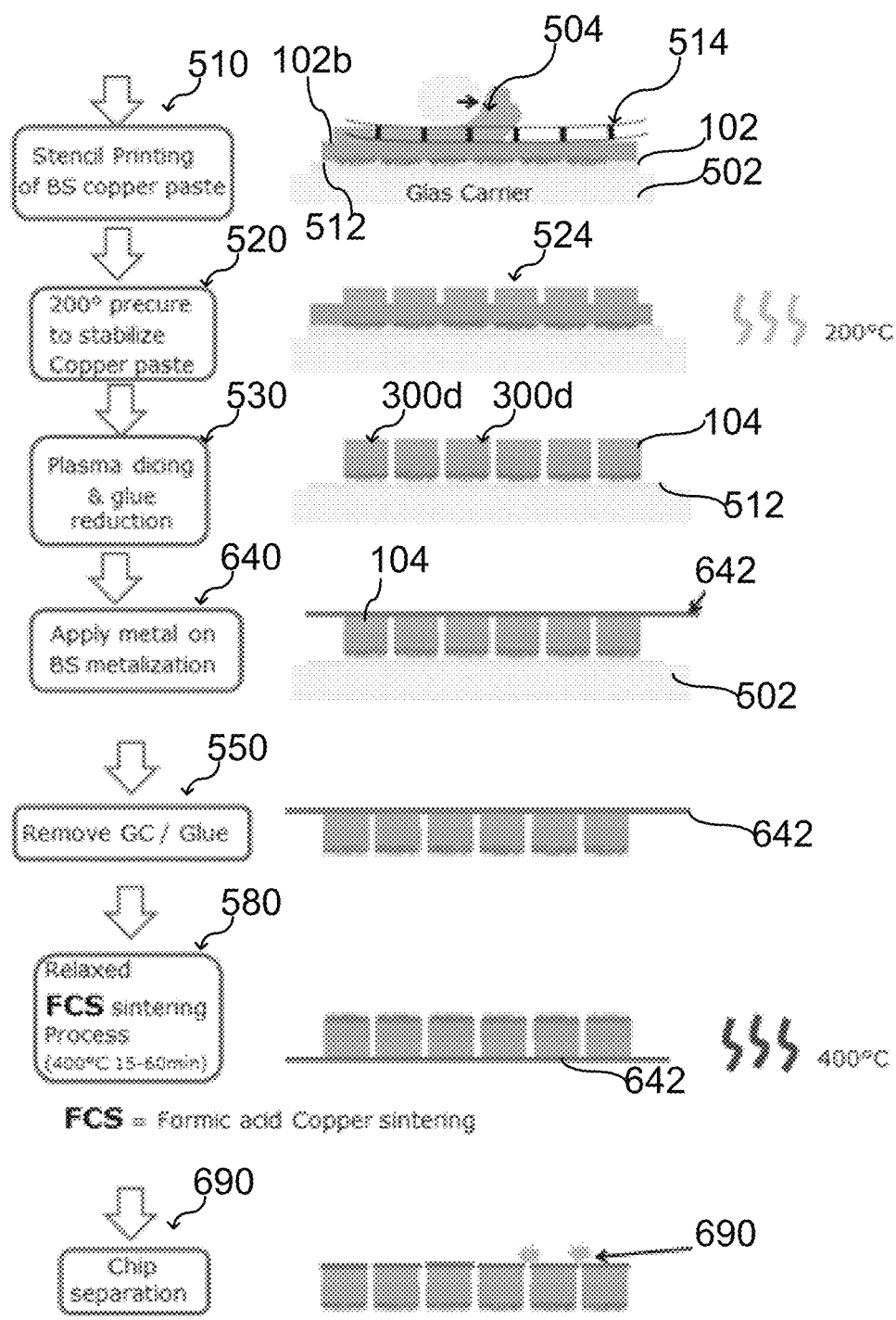
FIG. 6A shows a semiconductor substrate in a schematic cross sectional view at various stages during processing according to various embodiments.

FIG. 6A shows a semiconductor substrate in a schematic cross sectional view at various stages during processing and a corresponding process flow according to various embodiments. The process flow may base on the process flow as illustrated for example in FIG. 5.

The process flow illustrated in FIG. 6A may include for example at least one of the following: in 510, stencil printing as already described; in 520, pre-curing as already described; in 530, plasma dicing as already described; and further, in 640, applying a metal foil 642 on the pre-cured metal 104 (in other words attaching the metal foil 642 to the pre-cured metal paste 104 (e.g. copper paste 104) of the separated dies 300d); in 550, removing the glass carrier 502 and the glue 512 from the separated dies 300d as already described; and, in 580, performing a sintering process as already described.

According to various embodiments, the sintering process may be included in front-end processing. According to various embodiments, the dies 300d (the chips 300d) can be separated 690, e.g. by dicing the metal foil 642 between the dies 300d, e.g. by mechanical dicing using a metal wheel, by micro spark cutting, or by laser cutting, or the like.

According to various embodiments, the metal foil 642 may include or may consist of copper. Further, the adhesion of the metal foil 642 may be achieved by pressure or by use of an adhesion promoter substance, as for example additional copper nanoparticles.

Figure 6B:
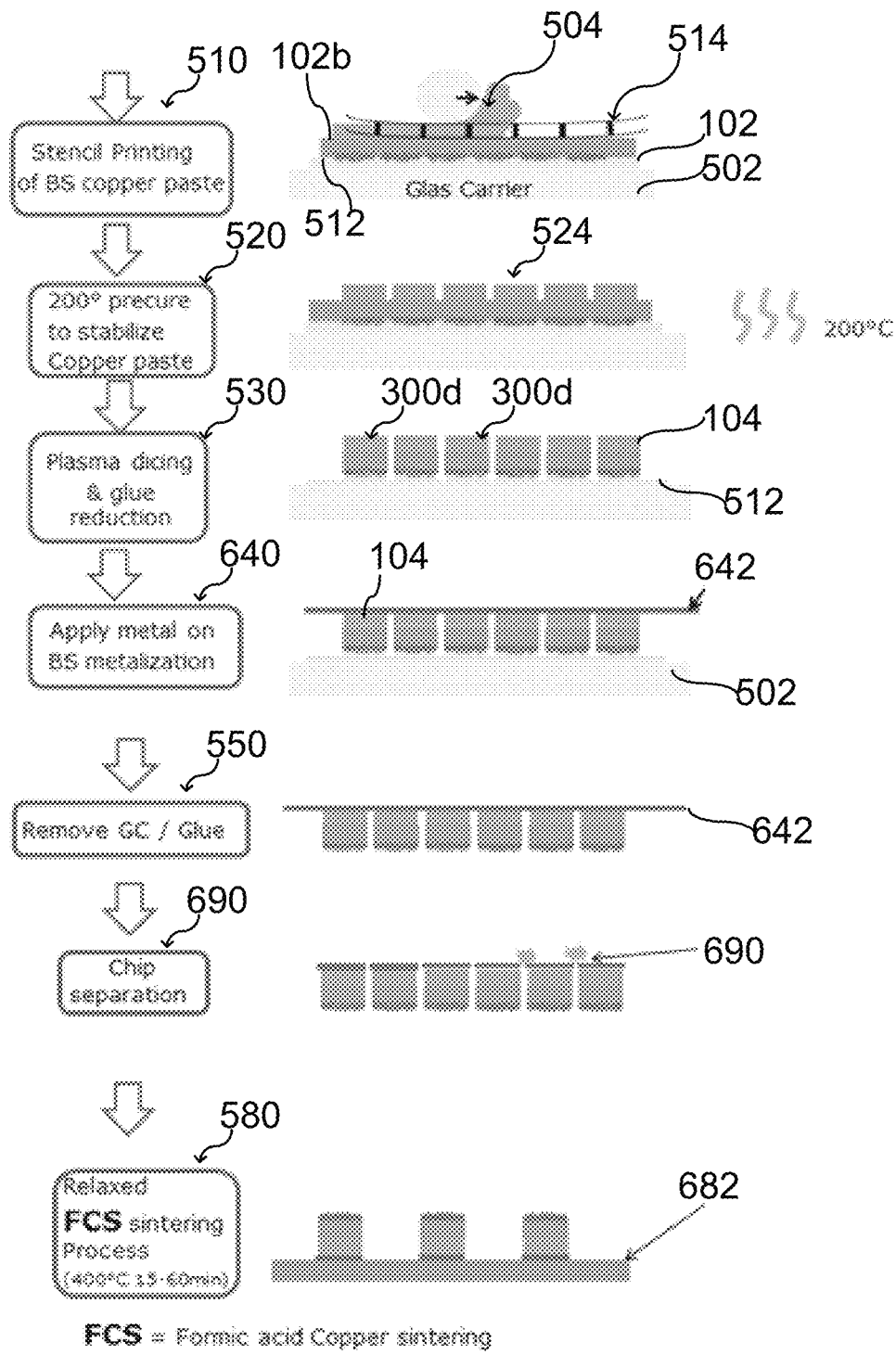
FIG. 6B shows a semiconductor substrate in a schematic cross sectional view at various stages during processing according to various embodiments.

Alternatively, as illustrated in the process flow in FIG. 6B, the sintering process 580 may be included in back-end processing. The dies 300d may be sintered for example on a lead frame 682 after the dies are separated 690.

According to various embodiments, the sintering 580 may be accomplished during die attach reflow in the back-end processing (e.g. by in-situ sintering during reflow; SDR). This may result in a cheap, reproducible, and reliable back side metal sintering process in back-end processing.

Figure 7A:
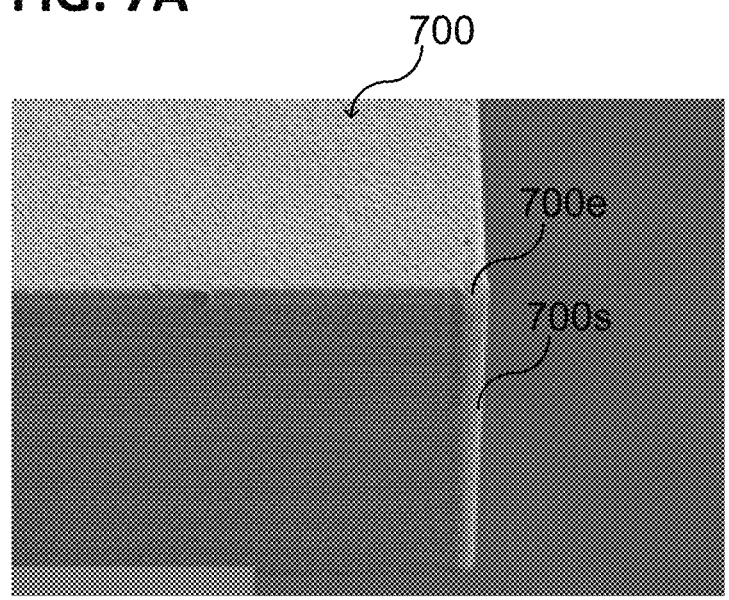
FIG. 7A shows an image of a plasma diced semiconductor die according to various embodiments.

FIG. 7A shows a scanning electron microscopy (SEM) image of a plasma diced semiconductor die 700 according to various embodiments. A plasma diced semiconductor die 700 may include typical scallops at the sidewalls 700s of the semiconductor die 700. The plasma diced semiconductor die 700 may have substantially undamaged edges 700e.

Figure 7B:
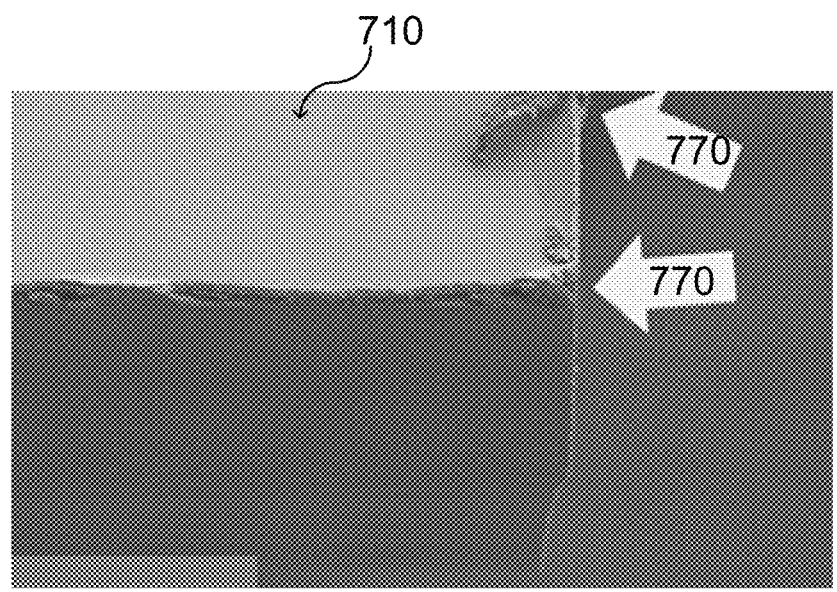
FIG. 7B shows an image of a semiconductor die diced by sawing.

In contrast, mechanical dicing (e.g. by sawing) may lead to a characteristic metal burr 770, as illustrated in FIG. 7B in an SEM image of a mechanically diced semiconductor die 710.

Figure 8A:
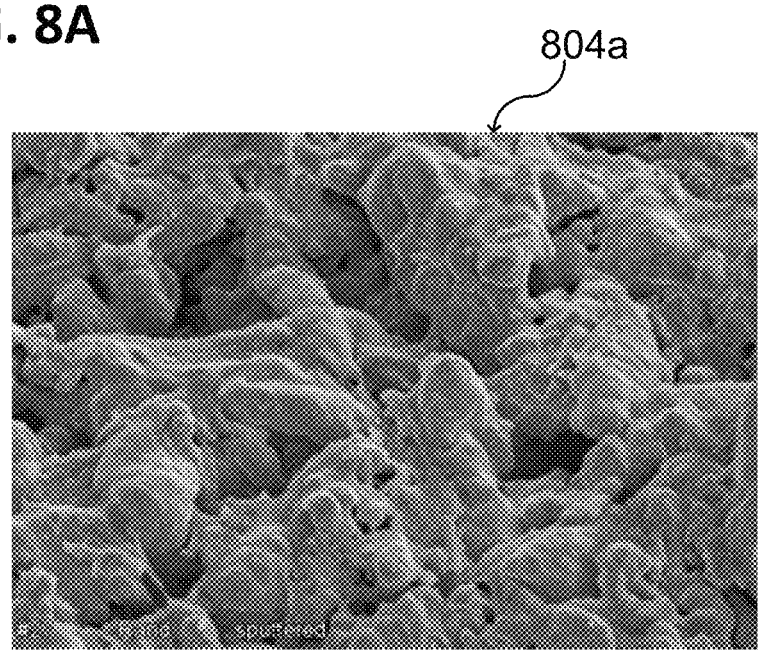
FIG. 8A shows an image of a sintered metal formed over a semiconductor die according to various embodiments.
Figure 8B:
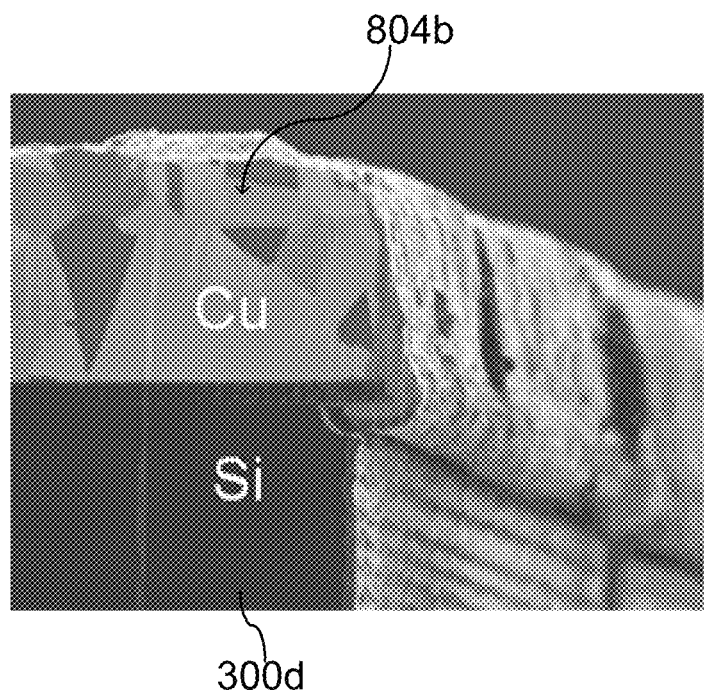
FIG. 8B shows an image of a semiconductor die covered with plated metal.

FIG. 8A shows an SEM image of a sintered metal 804a, e.g. sintered copper formed, for example, over a semiconductor die, according to various embodiments, whereas FIG. 8B shows an SEM image of a semiconductor die 300d covered with plated metal 804b, e.g. plated copper. The sintered metal 804a may be porous, e.g. with a porosity greater than about 5%, whereas the plated metal 804b may be dense. Further, the plated metal 804b may have large metal crystals grown during the plating process.

Figure 9A:
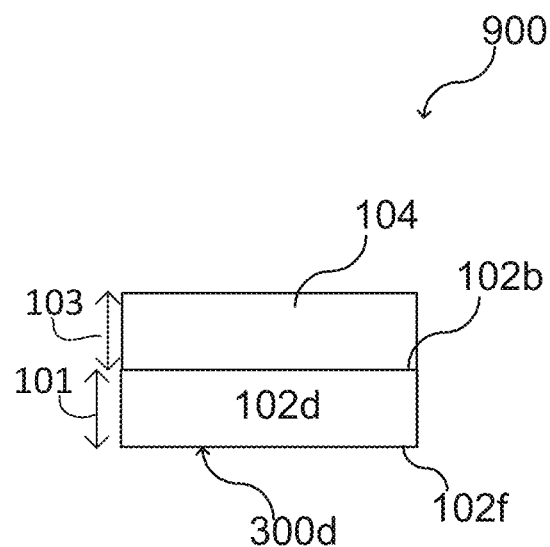
FIGS. 9A and 9B show an electronic device respectively in a schematic cross sectional view according to various embodiments.
Figure 9B:
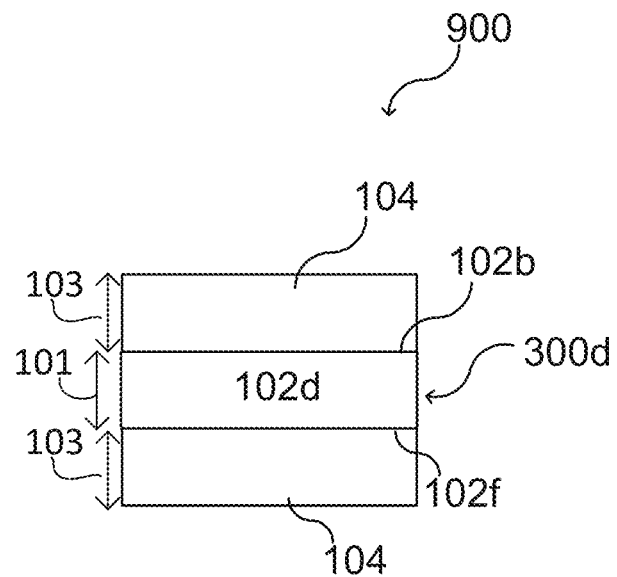

According to various embodiments, as illustrated in FIG. 9A and FIG. 9B in a schematic cross sectional view, for example in analogy to FIG. 3D, an electronic device 900 may include: a plasma diced semiconductor die 300d (e.g. including an integrated circuit structure or being configured as integrated circuit structure as already described), wherein at least one surface (e.g. a front side 102f and/or a back side 102b) of the plasma diced semiconductor die 300d is covered with a sintered metal layer 104, wherein the sintered metal layer 104 has a thickness 103 greater than or equal to 25% of a thickness 101 of the plasma diced semiconductor die 300d.

According to various embodiments, the at least one sintered metal layer 104 may include or may consist of sintered copper 104. Further, the at least one sintered metal layer 104 may cover the front side 102f and/or the back side 102b of the plasma diced semiconductor die 300d completely, e.g. since the at least one sintered metal layer 104 has been used as mask during plasma dicing to singulate the semiconductor die 300d from a semiconductor carrier 102, as already described.

According to various embodiments, the sintered metal layer 104 may be disposed at the front side 102f or at the back side 102b of the plasma diced semiconductor die 300d. Further, a first sintered metal layer 104 may be disposed at the front side 102f of the plasma diced semiconductor die 300d and a second sintered metal layer 104 may be disposed at the back side 102b of the plasma diced semiconductor die 300d.

According to various embodiments, the at least one sintered metal layer 104 may have a thickness 103 of about 10 μm wherein the plasma diced semiconductor die 300d has a thickness 101 of about 35 μm. According to various embodiments, the at least one sintered metal layer 104 may have a thickness 103 of about 20 μm wherein the plasma diced semiconductor die 300d has a thickness 101 of about 10 μm. According to various embodiments, the at least one sintered metal layer 104 may have a thickness 103 in the range from about 15 μm to about 25 μm, wherein the plasma diced semiconductor die 300d has a thickness 101 in the range from about 3 μm to about 15 μm.

According to various embodiments, the electronic device 900 may be a vertically integrated semiconductor device, e.g. a vertical smart FET.

Figure 10:
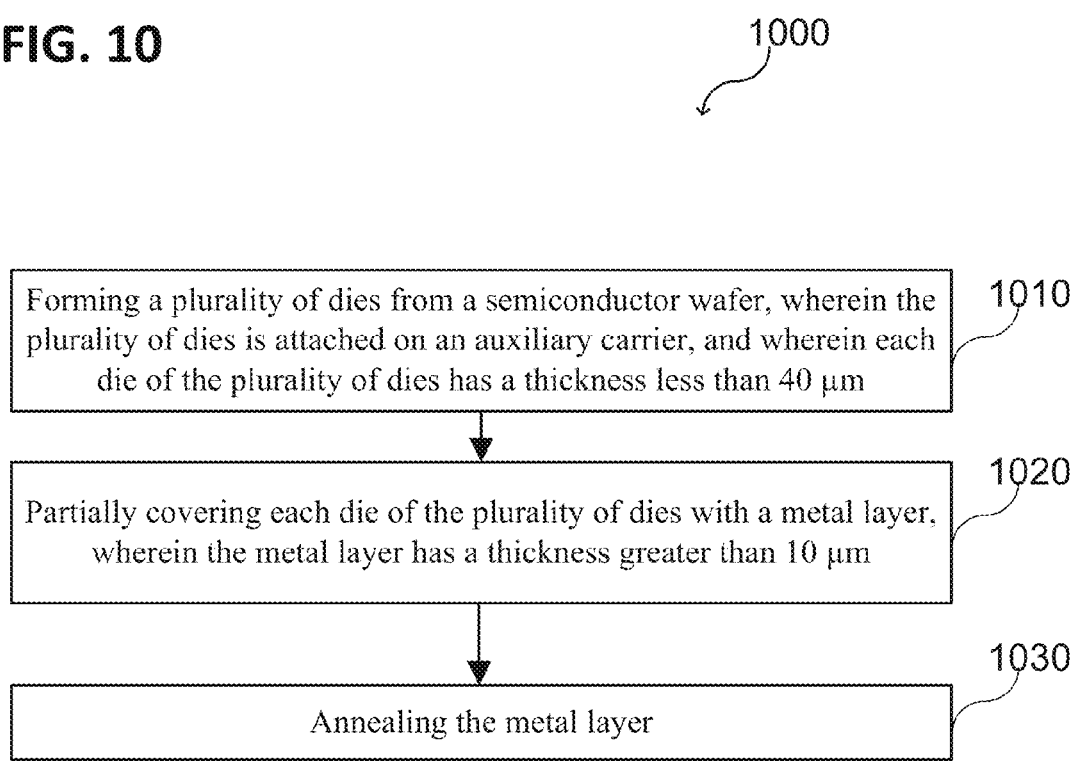
FIG. 10 shows a schematic flow diagram of a method for processing a semiconductor wafer according to various embodiments.

FIG. 10 shows a schematic flow diagram of a method 1000 for processing a semiconductor wafer according to various embodiments. The method 1000 may include: in 1010, forming a plurality of dies from a semiconductor wafer (e.g. by dicing the semiconductor wafer), wherein the dies of the plurality of dies are attached on an auxiliary carrier, and wherein each die of the plurality of dies has a thickness less than about 40 μm; in 1020, partially covering each die of the plurality of dies with a metal layer (e.g. covering a side of the die facing away from the auxiliary carrier, e.g. a back side of the die, with the metal layer), wherein the metal layer has a thickness greater than 10 μm; and, subsequently in 1030, annealing the metal layer.

According to various embodiments, the dies may be handled on wafer-level (e.g. the dies may be connected to each other, e.g. side by side, to form a carrier in wafer shape) while method 1000 is carried out. The auxiliary carrier may be temperature stable, as already described herein.

According to various embodiments, as an alternative to stencil printing, as for example described with reference to FIG. 5 and FIGS. 6A and 6B, an imide grid may be formed over the semiconductor carrier 102, and, subsequently, the metal paste may be applied so that the imide grid defines the pattern of the metal paste instead of using the stencil mask 514. Further, according to various embodiments, using the glass carrier 502 may allow an accurate thinning of the semiconductor carrier 102 via back side grinding. However, the glass carrier 502 and/or the used glue 512 to fix the semiconductor carrier 102 at the glass carrier 502 may be used for the pre-annealing but not for the annealing, since the glass carrier 502 and/or the used glue 512 may only be temperature stable up to about 200° C., for example. Therefore, the dies may be transferred to a temperature stable auxiliary carrier before the annealing is carried out.

According to various embodiments, the annealing (and optionally the pre-annealing) may be carried out by direct heating, e.g. by using a hot plate, or by radiation heating, e.g. using a laser or a lamp.

According to various embodiments, a method may include: covering a plurality of die regions of a semiconductor substrate with a metal; forming a plurality of dies from the semiconductor substrate, wherein each die of the plurality of dies is covered with the metal (e.g. wherein a front side and/or a back side of the respective die is covered with the metal); and, subsequently, annealing the metal covering at least one die of the plurality of dies.

Further, the annealing may be performed at a temperature greater than or equal to about 220° C., e.g. greater than or equal to about 250° C. Further, an annealing duration of the annealing may be greater than or equal to about 15 min. Further, the annealing may include heating the metal (and the at least one die) at a temperature greater than about 250° C. for more than 15 min. Further, the annealing may be performed in presence of formic acid.

Further, each die region of the semiconductor substrate may include an integrated circuit structure. Further, the die regions of the semiconductor substrate may be separated from each other by one or more dicing regions (e.g. by one or more kerf regions).

Further, the metal may cover more than 50% of a front side or of a back side of the semiconductor substrate. Further, the metal may cover more than 80% of a front side or of a back side of the respective die. Further, all dies formed from the semiconductor substrate may be annealed together, e.g. mounted on an auxiliary carrier.

According to various embodiments, covering the plurality of die regions with a metal may include forming a metal layer over the semiconductor substrate and, subsequently, patterning the metal layer.

Further, forming the metal layer may include a PVD or a CVD process. Further, forming the metal layer may include plating, e.g. electroless plating. Further, forming the metal layer may include electroless deposition.

According to various embodiments, covering the plurality of die regions with a metal may include printing a suspension (e.g. an ink or a paste) containing the metal (e.g. in form of particles) over the plurality of die regions of the semiconductor substrate.

According to various embodiments, the method may further include: pre-annealing (pre-curing) the suspension (e.g. the ink or the paste) after printing.

Further, the pre-annealing may be performed at a temperature less than or equal to about 220° C., e.g. less than or equal to about 200° C.

According to various embodiments, printing the suspension may include stencil printing.

According to various embodiments, the metal may include or may be copper.

According to various embodiments, the metal may include or may be a copper alloy.

According to various embodiments, the semiconductor substrate may be a semiconductor wafer. Further, the semiconductor substrate may include silicon or may consist of silicon. Further, the semiconductor wafer may be a silicon wafer. Further, the semiconductor wafer may be or may include a recon wafer. Further, the semiconductor wafer may have a diameter or width from about 5 cm to about 50 cm. Further, the semiconductor wafer may have a diameter or width greater than about 5 cm (e.g. greater than about 10 cm) and a thickness less than about 100 µm, 50 µm, 40 µm, 30 µm, 20 µm, 15 µm, 10 µm, or 5 µm. A high aspect ratio of the semiconductor wafer may reduce the mechanical stability of the semiconductor wafer so that an influence of the metal may need to be considered in the processing.

According to various embodiments, the semiconductor substrate may have a thickness less than about 100 µm.

According to various embodiments, the metal covering each die of the plurality of dies may have a thickness greater than about 3 µm. Further, the metal covering each die of the plurality of dies may have a thickness greater than about 5 µm, e.g. greater than about 10 µm or 15 µm.

According to various embodiments, the metal covering each die of the plurality of dies may have a thickness greater than or equal to about 25% of a thickness of the semiconductor substrate. The relation of the thicknesses of the metal and the semiconductor substrate may influence the amount of stress created in or transferred into the semiconductor substrate or may influence the deformation of the semiconductor substrate and the metal.

According to various embodiments, forming the plurality of dies from the semiconductor substrate may include dicing. Further, forming the plurality of dies from the semiconductor substrate may include at least one of mechanical dicing using a dicing saw, thermal dicing using a laser, or chemical dicing by etching.

According to various embodiments, forming the plurality of dies from the semiconductor substrate may include plasma dicing, wherein the metal covering the plurality of die regions of the semiconductor substrate may be used as mask for the plasma dicing.

According to various embodiments, the method may further include: mounting the semiconductor substrate on a glass carrier before dicing so that the dies of the plurality of dies are adhered to the glass carrier after dicing.

According to various embodiments, the method may further include: adhering the at least one die of the plurality of dies with the metal to a metal layer before the annealing.

Further, the metal layer may include at least one of a metal foil or a lead frame.

According to various embodiments, the method may further include: adhering the at least one die of the plurality of dies to an auxiliary carrier before the annealing. Further, one or more of the dies may be transferred to an auxiliary carrier via a transfer foil. Further, the auxiliary carrier (e.g. including polyimide or Kapton) may be temperature stable, e.g. at least up to about 400° C. Further, the at least one die of the plurality of dies may be adhered to the auxiliary carrier via a temperature stable glue (e.g. including photo imide, e.g. spin coated or spray coated photo imide).

According to various embodiments, a method may include: printing a layer over a semiconductor wafer, the layer including metal particles (e.g. suspended in a solvent (also referred to as ink or paste)); pre-annealing the layer (e.g. to at least partially expel the solvent); dicing the semiconductor wafer into a plurality of dies, wherein each die of the plurality of dies may be covered (e.g. a front side and/or a backside of each die of the plurality of dies may be covered) with metal particles of the pre-annealed layer; and, subsequently, sintering the metal particles of the pre-annealed layer.

According to various embodiments, dicing the semiconductor wafer may include plasma dicing.

According to various embodiments, the sintered metal particles may provide a backside metallization of the respective die.

According to various embodiments, the metal particles may include copper or may be copper particles. Further, the metal particles may include nano particles and/or micro particles.

According to various embodiments, a method may include: forming a plurality of dies from a semiconductor wafer, wherein the plurality of dies may be attached on an auxiliary carrier, and wherein each die of the plurality of dies may have a thickness less than about 40 μm; partially covering each die of the plurality of dies with a metal layer, wherein the metal layer has a thickness greater than about 10 μm; and, subsequently, annealing the metal layer.

According to various embodiments, an electronic device (e.g. a semiconductor device or a vertically integrated semiconductor device) may include: a plasma diced semiconductor die, wherein at least one surface of the plasma diced semiconductor die is covered with a sintered metal layer; wherein the sintered metal layer has a thickness greater than or equal to about 25% of a thickness of the semiconductor die.

According to various embodiments, a method may include: covering a plurality of die regions of a semiconductor substrate with a metal to be annealed; forming a plurality of dies from the semiconductor substrate, wherein each die of the plurality of dies is covered with the metal, and, subsequently, annealing the metal covering at least one die of the plurality of dies.

According to various embodiments, a method may include: covering a plurality of die regions of a semiconductor substrate with a metal, wherein the metal is structured according to a die pattern; forming a plurality of dies from the semiconductor substrate, wherein each die of the plurality of dies is covered with the metal (e.g. the metal may mask the semiconductor substrate according to the desired die-dimensions to be formed from the semiconductor substrate); and, subsequently, annealing the metal covering at least one die of the plurality of dies.

According to various embodiments, a method may include: covering a plurality of die regions of a semiconductor substrate with a metal containing material; forming a plurality of dies from the semiconductor substrate, wherein each die of the plurality of dies is covered with the metal containing material, and, subsequently, annealing (e.g. sintering) the metal containing material covering at least one die of the plurality of dies. The metal containing material may include a metal, e.g. a pure metal layer or a metal alloy layer, or a metal and at least one other material than a metal, e.g. an ink including a metal or a paste including a metal.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method comprising:
covering a plurality of die regions of a semiconductor substrate with a metal to be annealed;
forming a plurality of dies from the semiconductor substrate, wherein each die of the plurality of dies is covered with the metal, and, subsequently,
annealing the metal covering at least one die of the plurality of dies,
wherein covering the plurality of die regions with a metal comprises printing a suspension containing the metal over the plurality of die regions of the semiconductor substrate.

2. The method of claim 1, further comprising:
pre-annealing the suspension after printing.

3. The method of claim 1,
wherein printing the suspension comprises stencil printing.

4. The method of claim 1,
wherein the metal comprises copper.

5. The method of claim 1,
wherein the semiconductor substrate is a semiconductor wafer.

6. The method of claim 1,
wherein the semiconductor substrate has a thickness less than 100 μm.

7. The method of claim 1,
wherein the metal covering each die of the plurality of dies has a thickness greater than or equal to 25% of a thickness of the semiconductor substrate.

8. The method of claim 1,
wherein forming the plurality of dies from the semiconductor substrate comprises dicing.

9. The method of claim 1,
wherein forming the plurality of dies from the semiconductor substrate comprises plasma dicing and wherein the metal covering the plurality of die regions of the semiconductor substrate is used as mask for the plasma dicing.

10. The method of claim 9, further comprising:
mounting the semiconductor substrate on a glass carrier before dicing so that the dies of the plurality of dies are adhered to the glass carrier after dicing.

11. The method of claim 1, further comprising:
adhering the at least one die of the plurality of dies with the metal to a metal layer before the annealing.

12. The method of claim 1, further comprising:
adhering the at least one die of the plurality of dies to an auxiliary carrier before the annealing.

13. The method of claim 1,
wherein the metal covering the plurality of die regions of the semiconductor substrate forms a backside metallization.

14. A method comprising:
printing a layer over a semiconductor wafer, the layer comprising metal particles;
pre-annealing the layer;
separating the semiconductor wafer into a plurality of dies, wherein each die of the plurality of dies is covered with metal particles of the pre-annealed layer; and, subsequently,
sintering the metal particles of the pre-annealed layer.

15. The method of claim 14,
wherein separating the semiconductor wafer comprises plasma dicing.

16. The method of claim 14,
wherein the sintered metal particles provide a backside metallization.

17. The method of claim 14,
wherein the metal particles comprise copper particles.

\* \* \* \* \*